United States Patent [19]

Ferrante et al.

[11] Patent Number: 5,407,527

[45] Date of Patent: Apr. 18, 1995

[54] AUTOMATED PROCESS FOR THE MANUFACTURE OF FLEXIBLE PLATES AND APPARATUS FOR IMPLEMENTING THE PROCESS

[75] Inventors: Mario Ferrante, Laxou; Raymond Boucher, Villers Les Nancy, both of France

[73] Assignee: Photomeca, Pompey, France

[21] Appl. No.: 67,290

[22] Filed: May 25, 1993

[30] Foreign Application Priority Data

May 25, 1992 [FR] France .................. 92 06537

[51] Int. Cl.⁶ ............................ B05C 1/00; B05D 1/00
[52] U.S. Cl. ..................................... 156/637; 156/645;
156/345; 156/625; 134/117; 134/6; 134/95.1
[58] Field of Search ............... 156/345, 637, 639, 636,
156/645, 625; 134/6, 42, 133, 117, 134, 124,
137, 157, 159, 135, 95.1

[56] References Cited

U.S. PATENT DOCUMENTS

| | | | |
|---|---|---|---|
| 4,196,018 | 4/1980 | Inoko et al. | 134/6 |
| 4,259,002 | 3/1981 | Thawley et al. | 134/72 X |
| 4,555,302 | 11/1985 | Urbanik | 156/637 |
| 4,872,946 | 10/1989 | Uesugi et al. | 156/645 |
| 5,067,193 | 11/1991 | Thomas | 134/6 |
| 5,223,041 | 6/1993 | Cerney | 134/15 |

*Primary Examiner*—Thi Dang
*Attorney, Agent, or Firm*—Weiser & Associates

[57] ABSTRACT

An automated process, and a device for implementing the process, for preparing a printing block from a photopolymer plate which has been previously exposed to ultraviolet radiation to convert it into a printing block for flexography or typography, or dry offset. The process includes at least the steps of lowering the plate with its sensitive face down into an etching vat, and then etching the plate by the resultant effect of a reciprocating horizontal movement of plane brushes and a to-and-fro movement of the etching vat in a horizontal direction perpendicular to that of the brushes, with the plate being held in place by gravity during the etching.

11 Claims, 3 Drawing Sheets

AUTOMATED PROCESS FOR THE MANUFACTURE OF FLEXIBLE PLATES AND APPARATUS FOR IMPLEMENTING THE PROCESS

BACKGROUND OF THE INVENTION

The present invention relates to a process for preparing flexible blocks which can be used for printing in flexography, typography or dry offset. The present invention also relates to a device for implementing the process.

More exactly, the invention relates to a process for processing photopolymer plates of any format very quickly, in order to convert them into printing blocks.

It is already known that it is possible to obtain a block for flexography or typography by exposing a plate of a photopolymer which is sensitive to ultraviolet radiation, with the interposition of a negative film which leaves exposed to the radiation those zones which are to come into relief on the finished block.

The radiation hardens these zones, and the material from the protected surface is subsequently removed by brushing it using plane or rotary brushes or by spray nozzles; a solvent or water acting as wetting agent. The operation is continued until the zones which have been exposed are sufficiently in relief.

A first object of the invention is complete automation of the whole of the etching process.

Moreover, a wide range of photopolymer plates of all thicknesses and in all formats (up to 50×80 inches) are currently found on the market, and semi-automatic machines are already manufactured for producing them. In operation, the photopolymer block is fixed or bonded onto the block holder tray, and a plane brush with orbital movement, immersed in an etching bath, makes it possible to prepare blocks.

Another aim of the invention is therefore to prepare photopolymer blocks of all formats and thicknesses, in a simple machine, which allows an already exposed block to be introduced on one side of the machine, and to be taken out after etching, almost dry, in a minimum amount of time.

SUMMARY OF THE INVENTION

In order to achieve these aims, several problems had to be solved, and in particular:
decreasing the duration of the etching operation,
automatic holding of the block in the etching position,
fitting of the block into the etching position automatically.

In accordance with the invention, the novel process provided is characterised in that it comprises at least the following steps:
lowering of a plate with the face to be etched turned downwards, into an etching vat,
etching by the resultant effect of a reciprocating horizontal movement of plane brushes and of a to-and-fro movement of the etching vat in a horizontal direction perpendicular to that of the brushes, the plate being held automatically under gravity during etching.

Furthermore it preferably comprises the following prior steps:
introduction and fastening of the plate with its sensitive face turned upwards,
turning over the plate through 180° and automatic fitting it in an etching position, with the face to be etched turned downwards.

It further preferably comprises, after etching, the following steps:
automatic raising of the plate,
automatic rinsing and cleaning of the surface and of the back of the plate while it is turned over through 180°,
transfer and inspection of the plate, etched face turned to the top,
pre-drying.

BRIEF DESCRIPTION OF THE DRAWINGS

The invention will be better understood with the aid of the following description which is given with reference to the following attached figures.

DESCRIPTION OF PREFERRED EMBODIMENTS

The process according to the invention comprises at least the following steps:

Quiescent step (see FIG. 1):

A photopolymer plate (0), previously exposed to UV rays, is attached onto a feed bar (1) by the operator.

Figure 2:
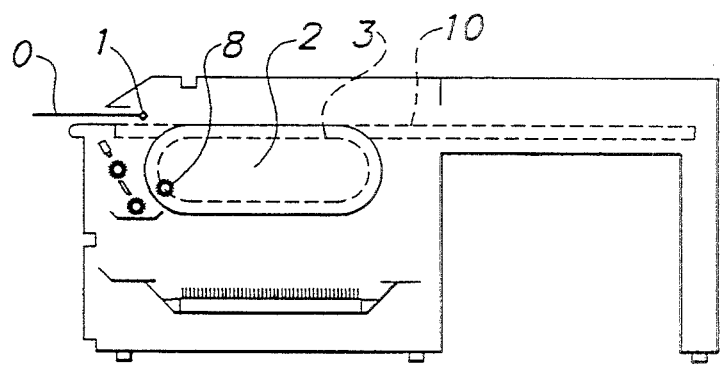
FIGS. 2 to 7 are schematic drawings showing the following steps of the process.

Introduction of the plate (0) (FIG. 2):

The operator introduces the bar at the input of the machine on the input table.

The operator pushes a start button, having previously adjusted the etching time on the timer depending on the thickness of the photopolymer layer, as well as the quantity of regeneration solvent as a function of the necessary etching depth.

Turning over of the plate (0) (FIG. 3) and automatically fitting it in the etching position:

The photopolymer plate is fastened by one end to a bar (1).

This bar is driven for example at each end by studs mounted on the feed chain mounted on the floating drum above the etching tank.

Figure 3:
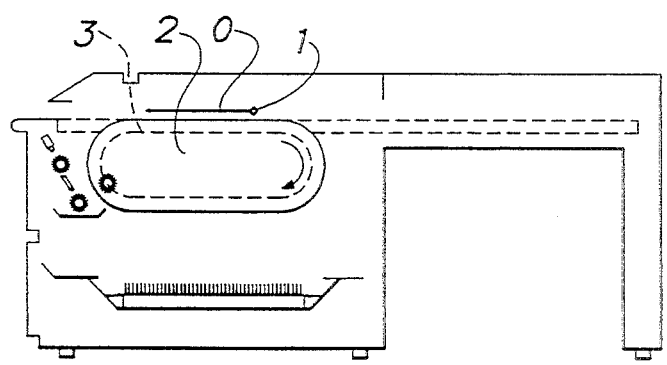

The bar (1) drives the photopolymer plate (0) on a drum (2) by means of studded chains (3) (FIG. 3).

Figure 4:
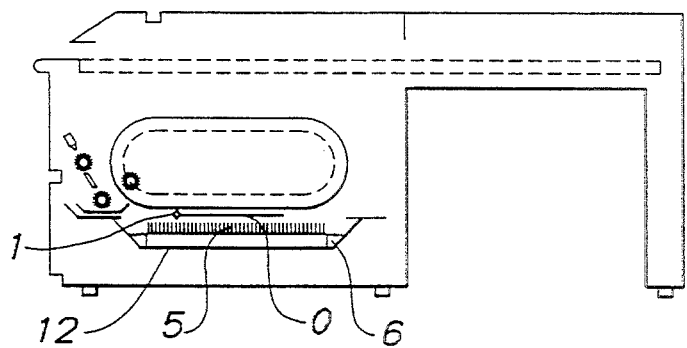

The plate goes around the drum (2) through 180° in order to become positioned (FIG. 4) on the surface of the plane brushes (5). It is then in the etching position.

Etching (FIGS. 4 and 8):

The drum (2) descends and comes to bear on the photopolymer plate.

Brushes (5) are dipped into the liquid (6).

The drum (2) does not move during the etching. It simply presses on the photopolymer plate (0) under gravity during the etching.

The plane brushes (5), four in number, are spaced apart in order to allow passage of the fastening system on the feed bar (1), and also to allow the removed polymer to dissolve and be drained very rapidly, in order for the etching to be performed under the best conditions.

Figure 8:
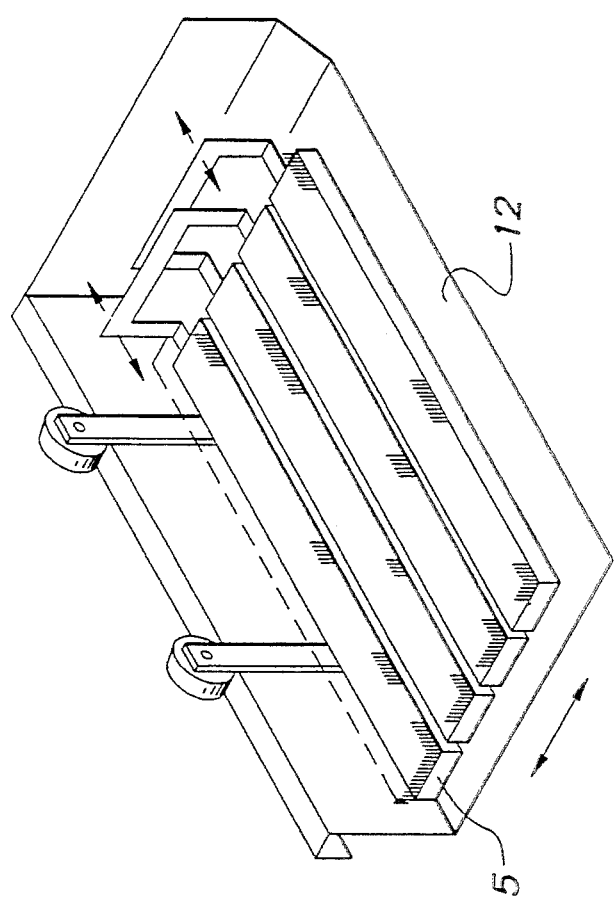
FIG. 8 is a schematic drawing showing the etching vat and the plane brushes.

The plane brushes (5) furthermore have a reciprocating movement with respect to each other, which makes it possible to hold the block always stationary in its initial position (FIG. 8). It should be noted that the block (0) may be of any size with respect to the format of the base of the drum (2), and any thickness.

In order to have uniform etching of the surface of the photopolymer plate, the etching vat (12), containing the liquid (6) and the plane brushes (5), have a lateral to-and-fro movement perpendicular to that of the plane brushes (5), as indicated in FIG. 8.

The resultant effect:
of the reciprocating horizontal movement of the plane brushes (5), and
of the to-and-fro movement of the lower vat (12) in a horizontal direction perpendicular to that of the brushes,
makes it possible to hold the plate (0) in a fixed position without fastening, and to have a perfect system for etching along two orthogonal directions over any surface of any dimension, and to do this in a single step. Thus, etching the entire surface, and of placing the photopolymer plate above the brushes in order to clear away the polymer as it is removed are performed in a single step, making it possible to solve one of the problems posed, namely the speed of the etching.

The problem of automatic holding of the blocks in the initial position during etching is solved by the reciprocating movement of the plane brushes.

Figure 5:
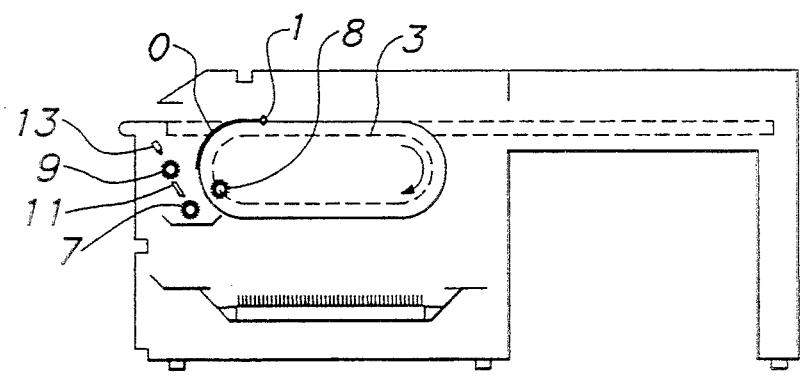

Rinsing and cleaning (FIG. 5):

Once the etching time has elapsed, the brushes (5) stop, the drum rises and the bar (1) drawn by the studded chains (3), pulls the plate around the drum.

A rotary brush (7) immersed in a vat of clean liquid, rinses the surface of the plate (0) automatically as it passes.

A rotary brush (8) immersed in a vat of clean liquid, rinses the back of the plate (0) automatically as it passes.

It should be noted that the brushes (7 and 8) self-clean each other automatically by rubbing when there is no plate (0) passing.

A third dense brush (9), wetted by a fresh liquid supply boom (13) wipes the surface of the plate (0) as it passes (relief of the printing plate).

Figure 6:
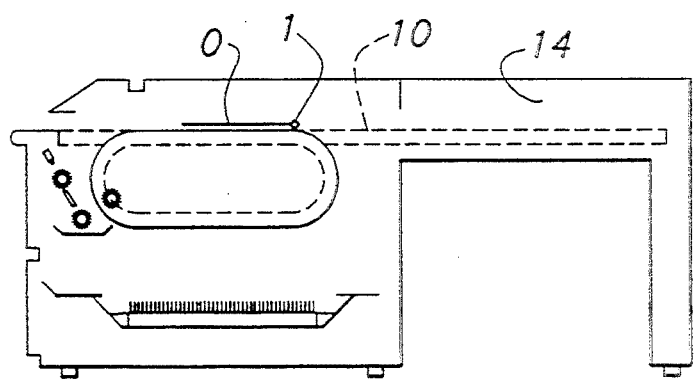

Transfer and inspection of the plate (FIG. 6):

The feed bar (1) continues its movement (FIG. 6), and is taken up by the studded chain (10) which conveys it into the pre-drying section (14). The plate may be inspected before pre-drying, and, in the case of insufficient etching, the operator has the possibility of reintroducing the plate into the etching section.

Figure 7:
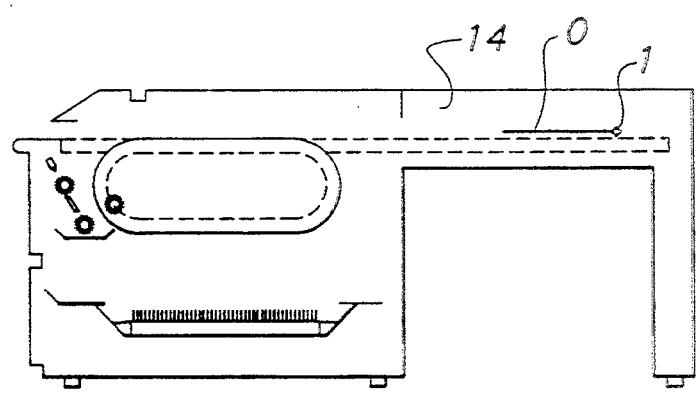

Pre-drying, end of cycle (FIG. 7):

When arriving in this pre-drying chamber (14), the surface of the plate is moist, but no drop of product remains on the plate (0). During the pre-drying, the chamber is heated to approximately 60°.

Given that the plate has stayed in contact with the liquid for a very short time during the etching, the polymer has absorbed very little liquid. There is hence practically no deformation of the lines of the image, and the drying time of the plates will be very short. The consumption of solvent will also be consequently reduced.

Figure 1:
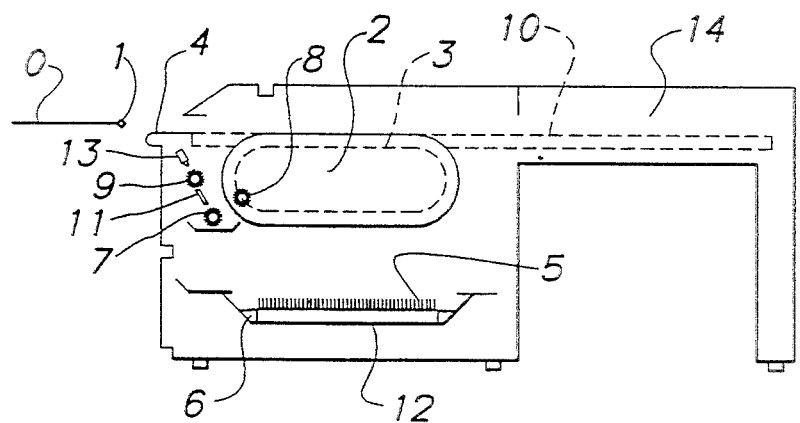
FIG. 1 is a schematic drawing of an embodiment of a device for implementing the process according to the invention, and showing the first step of the process.

When the photopolymer plate arrives in the predrying section (14), another plate can be reintroduced in accordance with the step of FIG. 1.

The process which has just been described makes it possible to etch one face of a photopolymer plate previously exposed to ultraviolet radiation, and having any thickness and dimension, and it may be applied to the field of flexography, typography or dry offset.

This process affords numerous advantages and/or particular functions, and in particular:
the absence of height adjustment of the brushes with respect to the thickness of the photopolymer plates, because the pressing of the plate on the brushes comes into play, as well as the etching time,
complete automation of the steps,
quality of the cleaning because the plate is etched sensitive face down,
quality and speed of etching by virtue also of this position of the sensitive plate, because the particles of polymer are taken away automatically under gravity and progressively,
100% saving in etching time by virtue of the stability of the plate and the etching of the entire surface of the plate in a single operation,
effectiveness of the cleaning/rinsing by the brush (7), because it is performed at the tangent of two rounded surfaces,
automatic regeneration of the liquid (6) in the vat (12) by flow of the rinsing liquid from the brush (7),
automatic mutual cleaning of the two brushes (7, 8) by rubbing when there is no plate passing,
automatic surface wiping of the plate by the brush (9) after the etching and rinsing time,
economy of liquid, because the brush (9) is sprinkled with clean liquid only before each time a plate passes,
return of the plate into initial position after 360° rotation, thus the etched face is visible during the predrying, and may be inspected,
possibility of etching the entire surface of the plate uniformly by the reciprocating translation of the entire lower vat and brushes assembly along a direction perpendicular to the movement of the brushes,
moving of the liquid by the reciprocating operation of the brushes,
passage provided for the system for fastening the plates onto the transport bar (1) by virtue of the separation of the brushes,
improved cleaning by the presence of a scraper (11) fitted to each brush (8, 9),
possibility of adapting the to-and-fro movement of the tank perpendicularly to the direction of operation of the brushes,
complete automation of the process,
very compact and completely hermetically sealed machine.

The invention also relates to a device for implementing the process described, and comprising, nonlimitingly, the means mentioned above, in particular, on the one hand, mechanical means for driving the vat in a horizontal to-and-fro movement, and a mechanical means for driving the plane brushes (5) in a reciprocating movement along a horizontal direction perpendicular to that of the vat, and, on the other hand, means for depositing the plate (0) under gravity on the plane brushes (5), face to be etched turned towards the said brushes.

Furthermore, the device preferably comprises:
a feed bar (1) comprising means for fastening the plate,
drive studs at each end of the bar (1), mounted on a feed chain mounted on a floating drum above the etching vat, means for lowering and raising the drum with respect to the etching vat, a rotary brush (7) and a rotary brush (8) immersed in a clean liquid vat and arranged so as to perform cleaning/rinsing of the plate at the tangent of two rounded surfaces.

a dense rotary brush (9) wetted by a fresh liquid spray boom (13) for wiping the plate.

an end-of-cycle pre-drying chamber.

The plane brushes preferably consist of a PVC or polypropylene medium, depending on the type of etching solution used. The diameters of the bristles of these brushes, and the density of the bunches are determined as a function of the type of photopolymer to be etched.

The bars for driving the photopolymer plates are equipped, for example, with grips which make it possible to fasten the plates of any thickness simply and quickly.

Any mechanical means for driving the brushes, the lower vat (12) and the other moving pieces may be envisaged.

We claim:

1. A process for preparing a printing block for flexography, typography or dry offset from a photopolymer plate having a sensitive face which is to be etched, and a back, and which has been previously exposed to ultraviolet radiation to convert the plate into a printing block, the process comprising the steps of:
    lowering the plate with its sensitive face turned downward into an etching vat, and
    etching the plate by a reciprocating horizontal movement of plane brushes, which are mounted facing upward to engage the downward facing sensitive face of the plate, and a to-and-fro movement of the etching vat in a horizontal direction perpendicular to the reciprocating horizontal movement of the brushes, wherein the plate is held in place by gravity during the etching.

2. The process of claim 1 which further comprises the prior steps of:
    fastening the plate with its sensitive face upward to a carrier means; and
    actuating the carrier means to turn the plate over through 180° to assume an etching position with the sensitive face turned downward.

3. The process of claim 2 which, after etching, further comprises the steps of:
    raising the plate out of the etching vat;
    actuating the carrier means to turn the plate over through 180° while rinsing and cleaning the sensitive face and the back of the plate; and
    further actuating the carrier means to place the plate in position for inspection of the etched sensitive face.

4. The process of claim 3 which further comprises the step of at least partially drying the plate.

5. An apparatus for preparing a printing block for flexography, typography or dry offset from a photopolymer plate having a sensitive face which is to be etched, and a back, and which has been previously exposed to ultraviolet radiation to convert the plate into a printing block, the apparatus comprising:
    an etching vat mounted for horizontal reciprocating movement and suitable for containing an etching liquid;
    upwardly facing plane brushes mounted for horizontal reciprocating movement in said etching vat;
    means for driving the etching vat in a horizontal reciprocating movement;
    means for driving the plane brushes in a horizontal reciprocating movement in a direction perpendicular to the movement of the vat; and
    means for depositing the plate under gravity on the plane brushes with the sensitive face of the plate turned toward the plane brushes.

6. The apparatus of claim 5 which further comprises:
    a drum mounted for vertical movement above the carrier means for engaging and holding the plate in a first position with its sensitive face upward on top of the drum, for transporting the plate to a second position with its sensitive face downward on the bottom of the drum, and for transporting the plate back to said first position; and
    means for lowering and raising the drum into and out of the etching vat.

7. The apparatus of claim 6 which further comprises two rotary brushes spaced from each other and mounted for rotational movement about parallel axes and positioned such that said carrier means can transport the plate, after etching, between the rotary brushes for cleaning and rinsing of the plate.

8. The apparatus of claim 7 wherein the plate is positioned tangent to the rotary brushes, and at least one of said rotary brushes is immersed in a vat for containing clean liquid.

9. The apparatus of claim 7 which further comprises an additional rotary brush for wiping the plate, and means for supplying clean liquid to said additional rotary brush.

10. The apparatus of claim 9 which further comprises an pre-drying chamber.

11. The apparatus of claim 5 which further comprises an pre-drying chamber.

* * * * *